(12) United States Patent  
Aggarwal et al.

(10) Patent No.: US 8,580,631 B2
(45) Date of Patent: Nov. 12, 2013

(54) HIGH SHEET RESISTOR IN CMOS FLOW

(75) Inventors: Rajni J. Aggarwal, Garland, TX (US); Jau-Yuann Yang, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 175 days.

(21) Appl. No.: 13/278,595

(22) Filed: Oct. 21, 2011

(65) Prior Publication Data

US 2012/0098071 A1 Apr. 26, 2012

Related U.S. Application Data

(60) Provisional application No. 61/406,392, filed on Oct. 25, 2010.

(51) Int. Cl.
*H01L 21/8238* (2006.01)
*H01L 21/336* (2006.01)
*H01L 21/8234* (2006.01)

(52) U.S. Cl.
USPC ........... 438/199; 438/197; 438/202; 438/210; 438/233

(58) Field of Classification Search
USPC ......... 438/210, 199, 202, 309, 197, 200, 329, 438/233, 381, 382, 203, 234, 236, 238, 247, 438/252, 163
See application file for complete search history.

(56) References Cited

U.S. PATENT DOCUMENTS

| | | | | |
|---|---|---|---|---|
| 6,010,929 | A * | 1/2000 | Chapman | 438/226 |
| 8,097,520 | B2 * | 1/2012 | Bu et al. | 438/381 |
| 8,247,280 | B2 * | 8/2012 | Sonsky et al. | 438/199 |
| 2010/0112764 | A1 * | 5/2010 | Mehrotra et al. | 438/210 |

* cited by examiner

*Primary Examiner* — Choung A. Luu
(74) *Attorney, Agent, or Firm* — Jacqueline J. Garner; Wade J. Brady, III; Frederick J. Telecky, Jr.

(57) ABSTRACT

An integrated circuit containing CMOS gates and a counterdoped polysilicon gate material resistor which has a body region that is implanted concurrently with the NSD layers of the NMOS transistors of the CMOS gates and concurrently with the PSD layers of the PMOS transistors of the CMOS gates, and has a resistor silicide block layer over the body region which is formed of separate material from the sidewall spacers on the CMOS gates. A process of forming an integrated circuit containing CMOS gates and a counterdoped polysilicon gate material resistor which implants the body region of the resistor concurrently with the NSD layers of the NMOS transistors of the CMOS gates and concurrently with the PSD layers of the PMOS transistors of the CMOS gates, and forms a resistor silicide block layer over the body region of separate material from the sidewall spacers on the CMOS gates.

16 Claims, 10 Drawing Sheets

HIGH SHEET RESISTOR IN CMOS FLOW

CROSS-REFERENCE TO RELATED APPLICATIONS

Field of the Invention

This invention relates to the field of integrated circuits. More particularly, this invention relates to polysilicon resistors in CMOS integrated circuits.

BACKGROUND OF THE INVENTION

An integrated circuit may contain complementary metal oxide semiconductor (CMOS) circuits which include n-channel metal oxide semiconductor (NMOS) transistors connected to p-channel metal oxide semiconductor (PMOS) transistors, in which the gates of the NMOS and PMOS transistors are formed of polycrystalline silicon, commonly known as polysilicon. The integrated circuit may also contain a resistors formed of polysilicon gate material. It may be desirable to form polysilicon resistors with sheet resistances over 1000 ohms/square, and may further be desirable to minimize fabrication cost and complexity of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing CMOS circuits which include polysilicon gate NMOS transistors and polysilicon gate PMOS transistors to form logic gates may also contain a counterdoped polysilicon gate material resistor with a sheet resistance over 1000 ohms/square, formed by ion implanting the body region of the resistor concurrently with the PMOS source/drain implant and the NMOS source/drain implant. Other implants used to form the NMOS and PMOS transistors in the CMOS logic circuits, for example the n-channel lightly doped drain (NLDD) and p-channel lightly doped drain (PLDD) implants, and possibly any implants into the polysilicon prior to etching the NMOS and PMOS gates, may concurrently implant the resistor body region. A silicide block layer is formed over the resistor body region prior to forming metal silicide on source and drain regions of the NMOS and PMOS transistors. The silicide block layer is formed separately from the sidewall spacers on the NMOS and PMOS gates. Head regions of the resistor are ion implanted concurrently with any combination of the implants used to form the NMOS and PMOS transistors in the CMOS logic circuits, so that the head regions are the same conductivity type as the body region. Implants which are not used to form the NMOS and PMOS transistors, for example implants used to form other components, are not used to form the inventive polysilicon resistor.

DETAILED DESCRIPTION OF EXAMPLE EMBODIMENTS

Figure 1A:
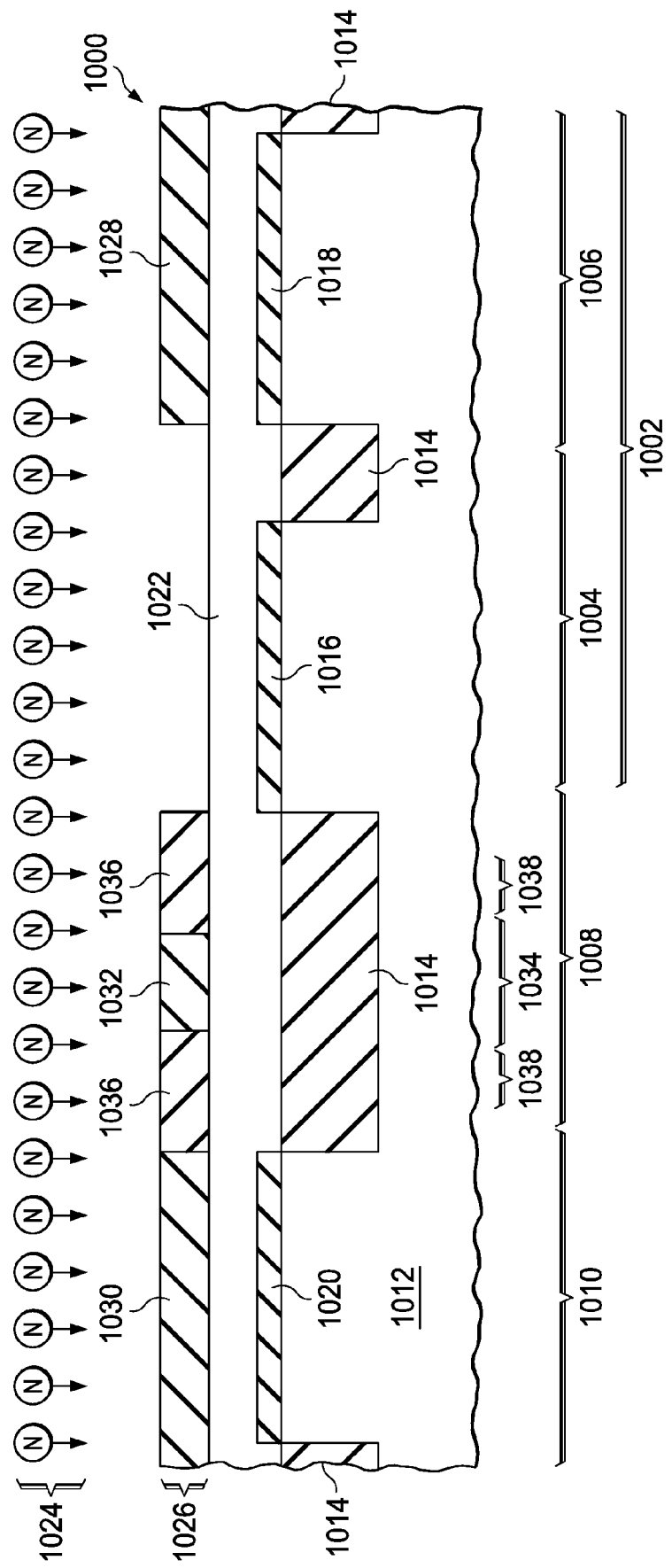
FIG. 1A through FIG. 1J are cross sections of an integrated circuit containing a CMOS circuit and a counterdoped polysilicon gate material resistor, referred to hereinafter as the resistor, formed according to an embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing CMOS circuits which include polysilicon gate NMOS transistors connected to polysilicon gate PMOS transistors to form logic gates may also contain a counterdoped polysilicon gate material resistor with a sheet resistance over 1000 ohms/square, formed by ion implanting the body region of the resistor concurrently with the PMOS source/drain implant and the NMOS source/drain implant. Other implants used to form the NMOS and PMOS transistors in the CMOS logic circuits, for example the NLDD and PLDD implants, and possibly any implants into the polysilicon prior to etching the NMOS and PMOS gates, may concurrently implant the resistor body region. A silicide block layer is formed over the resistor body region prior to forming metal silicide on source and drain regions of the NMOS and PMOS transistors. The silicide block layer is formed separately from the sidewall spacers on the NMOS and PMOS gates. Head regions of the resistor are ion implanted concurrently with any combination of the implants used to form the NMOS and PMOS transistors in the CMOS logic circuits, so that the head regions are the same conductivity type as the body region. Implants which are not used to form the NMOS and PMOS transistors, for example implants used to form other components, are not used to form the inventive counterdoped polysilicon gate material resistor.

FIG. 1A through FIG. 1J are cross sections of an integrated circuit containing a CMOS circuit and a counterdoped polysilicon gate material resistor, referred to hereinafter as the resistor, formed according to an embodiment, depicted in successive stages of fabrication. The integrated circuit 1000 includes an area defined for the CMOS circuit 1002 which includes an area defined for an NMOS transistor 1004 and an area defined for a PMOS transistor 1006. A drain node of the NMOS transistor will be electrically connected to a drain node of the PMOS transistor during fabrication of the integrated circuit 1000. The integrated circuit also includes an area defined for the resistor 1008. The integrated circuit may possibly contain an area defined for another component 1010, depicted in FIG. 1A through FIG. 1I as a second NMOS transistor which is formed using at least one ion implant operation which is not used to form the CMOS circuit NMOS transistor or the resistor.

The integrated circuit 1000 is formed in and on a substrate 1012 which may be a single crystal silicon wafer, a silicon-on-insulator (SOI) wafer, a hybrid orientation technology (HOT) wafer with regions of different crystal orientations, or other material appropriate for fabrication of the integrated circuit 1000. Elements of field oxide 1014 may be formed at a top surface of the substrate 1012, for example to electrically isolate the NMOS transistor form the PMOS transistor. In particular, an element of field oxide 1014 may be formed in the polysilicon gate material resistor area 1008 to electrically isolate the resistor from the substrate 1012. The field oxide 1014 may be silicon dioxide between 250 and 600 nanometers thick, formed by shallow trench isolation (STI) or local oxidation of silicon (LOCOS) processes. In STI processes, silicon dioxide may be deposited by high density plasma (HDP) or high aspect ratio process (HARP). An NMOS gate dielectric layer 1016 is formed at the top surface of the substrate 1012 in the NMOS transistor area 1004. A PMOS gate dielectric layer 1018 is formed at the top surface of the substrate 1012 in the PMOS transistor area 1006. A second NMOS gate dielectric layer 1020 is formed at the top surface of the substrate 1012 in the other component area 1010. The gate dielectric layers 1016, 1018 and 1020 may be one or more layers of silicon dioxide ($SiO_2$), silicon oxy-nitride (SiON), aluminum oxide ($Al_2O_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The gate dielectric layers 1016, 1018 and 1020 may include nitrogen as a result of exposure to a nitrogen containing plasma or a nitrogen containing ambient gas at temperatures between 50 C and 800 C. The gate dielectric layers 1016, 1018 and 1020 may be between 1 and 15 nanometers thick, depending on drain voltages applied to drain nodes of the respective transistors. The gate dielectric layers 1016, 1018 and 1020 may be formed by any of a variety of gate dielectric formation processes, for example thermal oxidation, plasma nitridation of an oxide layer, and/or dielectric material deposition by atomic layer deposition (ALD). Any portions or all of the gate dielectric layers 1016, 1018 and 1020 may be formed concurrently.

A gate polysilicon layer 1022 is formed over an existing top surface of the integrated circuit 1000. The gate polysilicon layer 1022 may be formed, for example, by thermally decomposing SiH4 gas inside a low-pressure reactor at a temperature between 580° C. to 650° C. The gate polysilicon layer 1022 may be, for example, between 50 and 1000 nanometers thick. The gate polysilicon layer 1022 may be doped during formation, or may be undoped.

An optional n-type pre gate etch implant operation 1024 may be performed on the integrated circuit 1000 which ion implants a pre etch set of n-type dopants into at least a portion of the gate polysilicon layer 1022. The optional n-type pre gate etch implant operation 1024, if performed, may implant for example phosphorus and arsenic and possibly antimony at a total does between $1\times10^{13}$ atoms/$cm^2$ and $1\times10^{15}$ atoms/$cm^2$. In one version of the instant embodiment, the optional n-type pre gate etch implant operation 1024 may implant the pre etch n-type dopants into the gate polysilicon layer 1022 over all areas of the integrated circuit 1000, commonly known as a blanket implant. In other versions of the instant embodiment, an optional n-type pre gate etch implant mask 1026 may be formed, for example of photoresist, over the gate polysilicon layer 1022 to block the pre etch n-type dopants from some areas. The n-type pre gate etch implant mask 1026 may include a PMOS blocking segment 1028 which blocks the pre etch n-type dopants from the PMOS transistor area 1006. The n-type pre gate etch implant mask 1026 may include an other component blocking segment 1030 which blocks the pre etch n-type dopants from the other component area 1010. The n-type pre gate etch implant mask 1026 may include a resistor body blocking segment 1032 which blocks the pre etch n-type dopants from a body region 1034 of the resistor. The n-type pre gate etch implant mask 1026 may include resistor head blocking segments 1036 which blocks the pre etch n-type dopants from head regions 1038 of the resistor. After the optional n-type pre gate etch implant operation 1024, if performed, is completed, the optional n-type pre gate etch implant mask 1026, if formed, is removed, for example by exposing the integrated circuit 1000 to an plasma containing oxygen, followed by a wet cleanup to remove any organic residue.

Figure 1B:
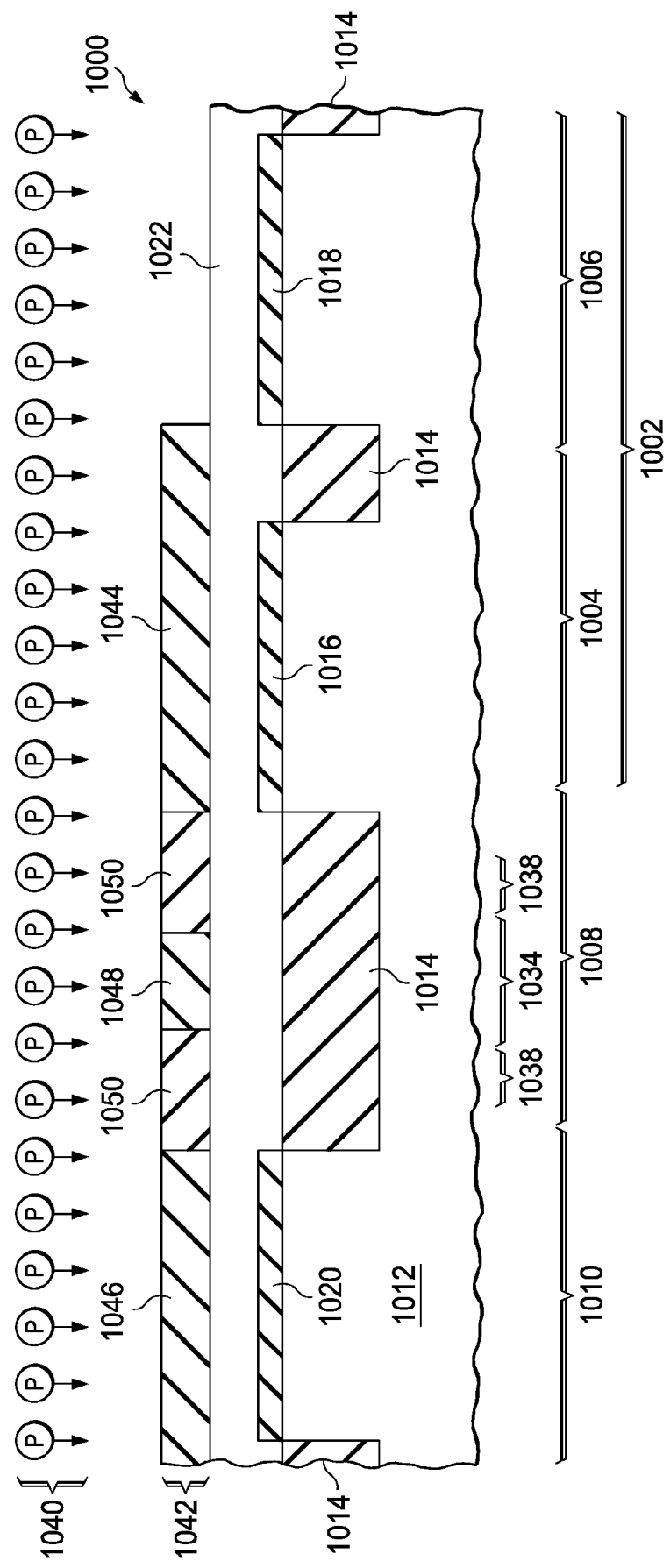

Referring to FIG. 1B, an optional p-type pre gate etch implant operation 1040 may be performed on the integrated circuit 1000 which ion implants a pre etch set of p-type dopants into at least a portion of the gate polysilicon layer 1022. The optional p-type pre gate etch implant operation 1040, if performed, may implant for example boron and possibly gallium and/or indium at a total dose between $1\times10^{13}$ atoms/$cm^2$ and $1\times10^{15}$ atoms/$cm^2$. In one version of the instant embodiment, the optional p-type pre gate etch implant operation 1040 may be a blanket implant. In other versions of the instant embodiment, an optional p-type pre gate etch implant mask 1042 may be formed, for example of photoresist, over the gate polysilicon layer 1022 to block the pre etch p-type dopants from some areas. The p-type pre gate etch implant mask 1042 may include an NMOS blocking segment 1044 which blocks the pre etch p-type dopants from the NMOS transistor area 1004. The p-type pre gate etch implant mask 1042 may include an other component blocking segment 1046 which blocks the pre etch p-type dopants from the other component area 1010. The p-type pre gate etch implant mask 1042 may include a resistor body blocking segment 1048 which blocks the pre etch p-type dopants from the body region 1034 of the resistor. The p-type pre gate etch implant mask 1042 may include resistor head blocking segments 1050 which blocks the pre etch p-type dopants from the head regions 1038 of the resistor. After the optional p-type pre gate etch implant operation 1040, if performed, is completed, the optional p-type pre gate etch implant mask 1042, if formed, is removed, for example as described in reference to FIG. 1A. In one version of the instant embodiment, the optional p-type pre gate etch implant operation 1040 may be performed before the optional n-type pre gate etch implant operation 1024.

Figure 1C:
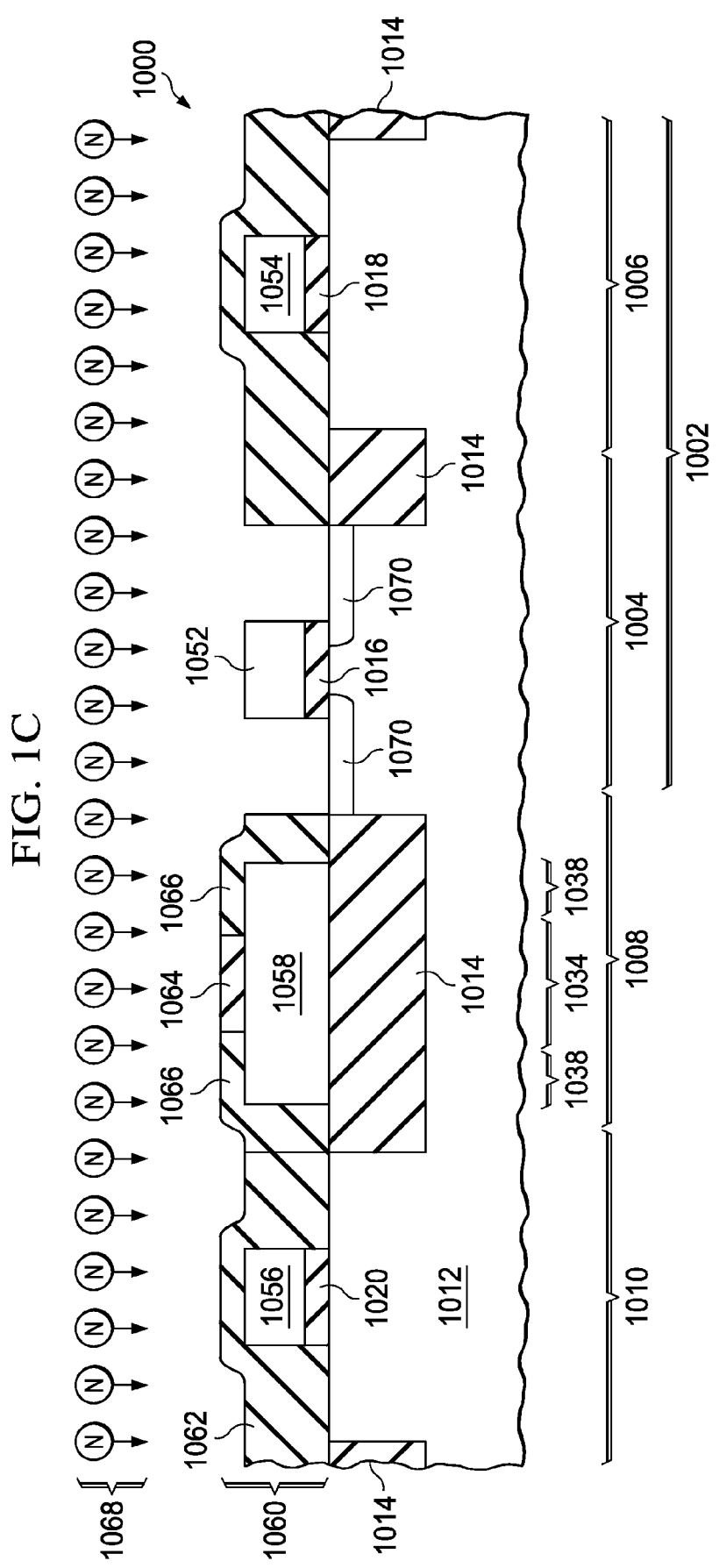

Referring to FIG. 1C, the gate polysilicon layer 1022 of FIG. 1A and FIG. 1B is etched to form an NMOS gate 1052 in the NMOS transistor area 1004, a PMOS gate 1054 in the PMOS transistor area 1006, a second NMOS gate 1056 in the other component area 1010 and a resistor layer 1058 in the resistor area 1008. In one version of the instant embodiment, the gate polysilicon layer 1022 may be etched, for example, by forming a gate etch hard mask layer, not shown, over the gate polysilicon layer 1022, followed by a photoresist gate etch mask, not shown, formed by a photolithographic process. A gate etch process, including for example a reactive ion etch (RIE) process using a plasma containing fluorine, removes unwanted material from the gate etch hard mask layer and the gate polysilicon layer 1022 using the photoresist gate etch mask to block removal by the RIE. The photoresist gate etch mask is removed during the gate etch process or after the gate etch process is completed. Other processes of etching the gate polysilicon layer 1022, such as multiple pass lithography to form the gate etch mask, is within the scope of the instant embodiment.

An NLDD implant mask 1060 is formed, for example of photoresist, over an existing top surface of the integrated circuit 1000 so as to expose the NMOS transistor area 1004. The NLDD implant mask 1060 may include an optional second NMOS blocking segment 1062 in the other component area 1010. The NLDD implant mask 1060 may include an optional resistor body blocking segment 1064 in the resistor area 1008 over the body region 1034. The NLDD implant mask 1060 may include optional resistor head blocking segments 1066 in the resistor area 1008 over the head regions 1038.

An NLDD implant operation 1068 is performed on the integrated circuit 1000 which ion implants an NLDD set of n-type dopants into the substrate 1012 in the NMOS transistor area 1004 to form NLDD implanted layers 1070 in the substrate 1012 adjacent to the NMOS gate 1052. The NLDD n-type dopants may include, for example phosphorus and arsenic and possibly antimony, implanted at a total dose between $2 \times 10^{14}$ atoms/cm$^2$ and $2 \times 10^{15}$ atoms/cm$^2$ at energies between 2 keV and 6 keV. The NLDD implant operation 1068 may also implant p-type dopants in a high angle configuration known as a halo implant. If the optional resistor body blocking segment 1064 is not formed, the NLDD implant operation 1068 implants the NLDD set of n-type dopants, and the p-type halo dopants if used, into the body region 1034 of the resistor layer 1058. If the optional resistor head blocking segments 1066 are not formed, the NLDD implant operation 1068 implants the NLDD set of n-type dopants, and the p-type halo dopants if used, into the head regions 1038 of the resistor layer 1058. After the NLDD implant operation 1068 is completed, the NLDD implant mask 1060 is removed, for example as described in reference to FIG. 1A.

Figure 1D:
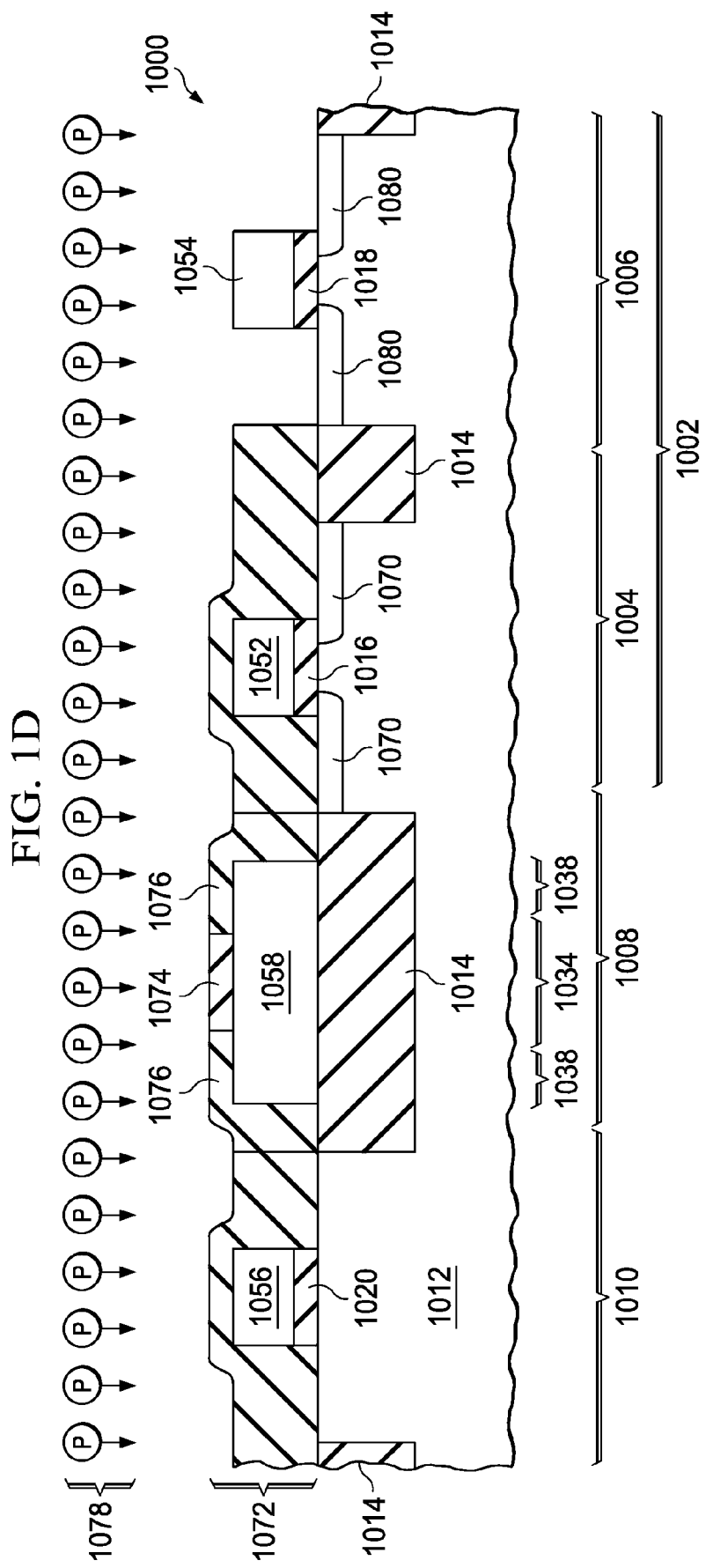

Referring to FIG. 1D, a PLDD implant mask 1072 is formed, for example of photoresist, over an existing top surface of the integrated circuit 1000 so as to expose the PMOS transistor area 1006. In the version of the instant embodiment depicted in FIG. 1D, the PLDD implant mask 1072 covers the other component area 1010. In other versions of the instant embodiment, for example in versions in which the other component is a second PMOS transistor, the PLDD implant mask 1072 may expose the other component area 1010. The PLDD implant mask 1072 may include an optional resistor body blocking segment 1074 in the resistor area 1008 over the body region 1034. The PLDD implant mask 1060 may include optional resistor head blocking segments 1076 in the resistor area 1008 over the head regions 1038.

A PLDD implant operation 1078 is performed on the integrated circuit 1000 which ion implants a PLDD set of p-type dopants into the substrate 1012 in the PMOS transistor area 1006 to form PLDD implanted layers 1080 in the substrate 1012 adjacent to the PMOS gate 1054. The PLDD p-type dopants may include, for example boron and boron difluoride and possibly gallium and/or indium, implanted at a total dose between $5 \times 10^{14}$ atoms/cm$^2$ and $5 \times 10^{15}$ atoms/cm$^2$ at energies between 1 keV and 8 keV. The PLDD implant operation 1078 may also implant n-type dopants in a halo implant. If the optional resistor body blocking segment 1074 is not formed, the PLDD implant operation 1078 implants the PLDD set of p-type dopants, and the n-type halo dopants if used, into the body region 1034 of the resistor layer 1058. If the optional resistor head blocking segments 1076 are not formed, the PLDD implant operation 1078 implants the PLDD set of p-type dopants, and the n-type halo dopants if used, into the head regions 1038 of the resistor layer 1058. After the PLDD implant operation 1078 is completed, the PLDD implant mask 1072 is removed, for example as described in reference to FIG. 1A.

Figure 1E:
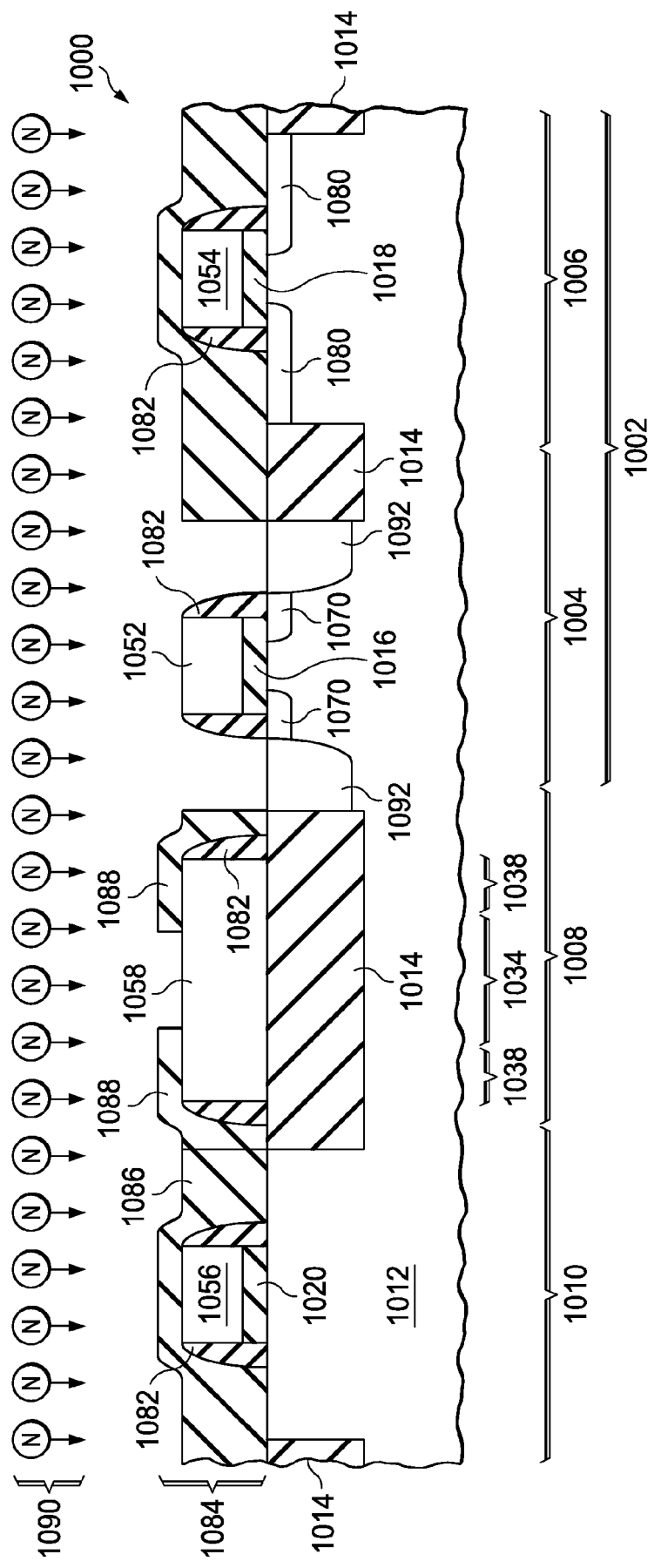

Referring to FIG. 1E, sidewall spacers 1082 are formed abutting the NMOS gate 1052, the PMOS gate 1054, the second NMOS gate 1056 and the resistor layer 1058. The sidewall spacers 1082 may be formed, for example, by formation of one or more conformal layers of silicon nitride and/or silicon dioxide on a an existing top surface of the integrated circuit 1000, followed by removal of the conformal layer material from horizontal surfaces by anisotropic etching methods, leaving the conformal layer material abutting the NMOS gate 1052, the PMOS gate 1054, the second NMOS gate 1056 and the resistor layer 1058.

Following formation of the sidewall spacers 1082, an NSD implant mask 1084 is formed, for example of photoresist, over an existing top surface of the integrated circuit 1000 so as to expose the NMOS transistor area 1004 and body region 1034 of the resistor layer 1058. The NSD implant mask 1084 may include an optional second NMOS blocking segment 1086 in the other component area 1010. The NSD implant mask 1084 may include optional resistor head blocking segments 1088 in the resistor area 1008 over the head regions 1038.

An NSD implant operation 1090 is performed on the integrated circuit 1000 which ion implants an NSD set of n-type dopants into the substrate 1012 in the NMOS transistor area 1004 to form NSD layers 1092 in the substrate 1012 adjacent to the NMOS gate 1052. The NSD n-type dopants may include, for example phosphorus and arsenic and possibly antimony, implanted at a total dose between $2 \times 10^{15}$ atoms/cm$^2$ and $2 \times 10^{16}$ atoms/cm$^2$ at energies between 1 keV and 6 keV. If the optional resistor head blocking segments 1088 are not formed, the NSD implant operation 1090 implants the NSD set of n-type dopants into the head regions 1038 of the resistor layer 1058. After the NSD implant operation 1090 is completed, the NSD implant mask 1084 is removed, for example as described in reference to FIG. 1A.

Figure 1F:
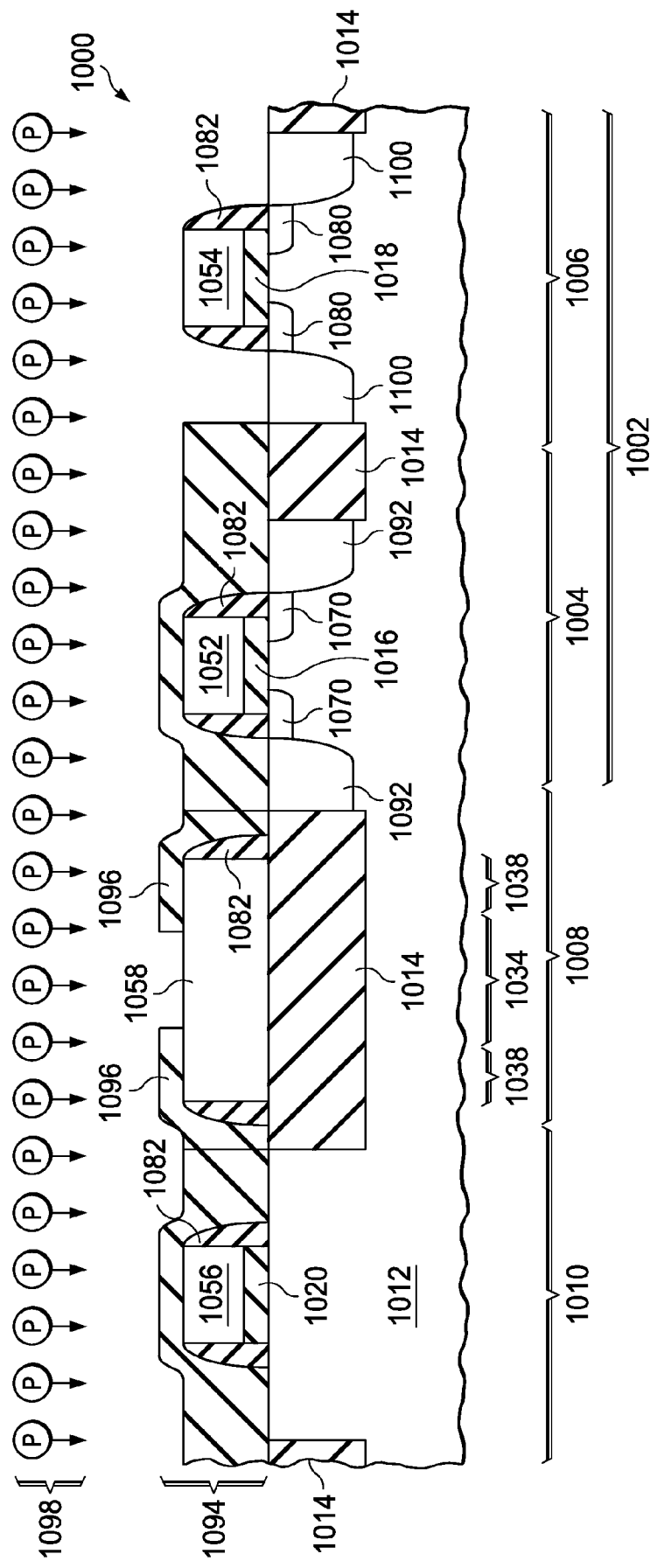

Referring to FIG. 1F, a PSD implant mask 1094 is formed, for example of photoresist, over an existing top surface of the integrated circuit 1000 so as to expose the PMOS transistor area 1006 and the body region 1034 of the resistor layer 1058. In the version of the instant embodiment depicted in FIG. 1F, the PSD implant mask 1094 covers the other component area 1010. In other versions of the instant embodiment, for example in versions in which the other component is a second PMOS transistor, the PSD implant mask 1094 may expose the other component area 1010. The PSD implant mask 1094 may include optional resistor head blocking segments 1096 in the resistor area 1008 over the head regions 1038.

A PSD implant operation 1098 is performed on the integrated circuit 1000 which ion implants a PSD set of p-type dopants into the substrate 1012 in the PMOS transistor area 1006 to form PSD layers 1100 in the substrate 1012 adjacent to the PMOS gate 1054. The PSD p-type dopants may include, for example boron and possibly gallium and/or indium, implanted at a total dose between $2 \times 10^{15}$ atoms/cm$^2$ and $1 \times 10^{16}$ atoms/cm$^2$ at energies between 1 keV and 8 keV. If the optional resistor head blocking segments 1096 are not formed, the PSD implant operation 1098 implants the PSD set of p-type dopants into the head regions 1038 of the resistor layer 1058. After the PSD implant operation 1098 is completed, the PSD implant mask 1094 is removed, for example as described in reference to FIG. 1A. The head regions 1038 have a same conductivity type as the body region 1034.

Figure 1G:
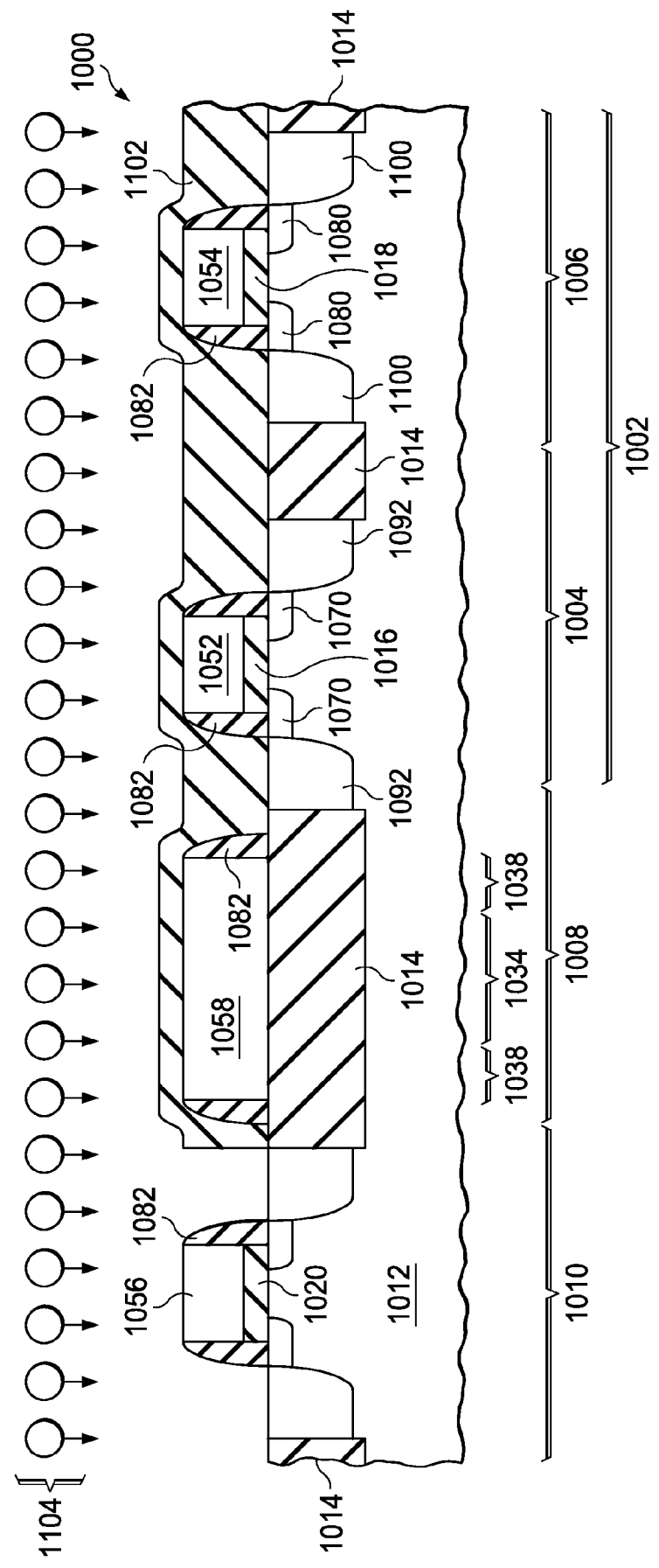

Referring to FIG. 1G, an optional other component implant mask 1102 may be formed over an existing top surface of the integrated circuit 1000 so as to expose the other component area 1010 and cover the CMOS area 1002 and the resistor area 1008. An other component implant operation 1104 is performed on the integrated circuit 1000 which implants dopants into the integrated circuit 1000 in the other component area 1010. Dopants from the other component implant operation 1104 are blocked from the CMOS area 1002 and the resistor area 1008. During fabrication of the integrated circuit 1000, dopants from any implant operation which are blocked from the CMOS area 1002 are also blocked from the resistor area 1008.

Figure 1H:
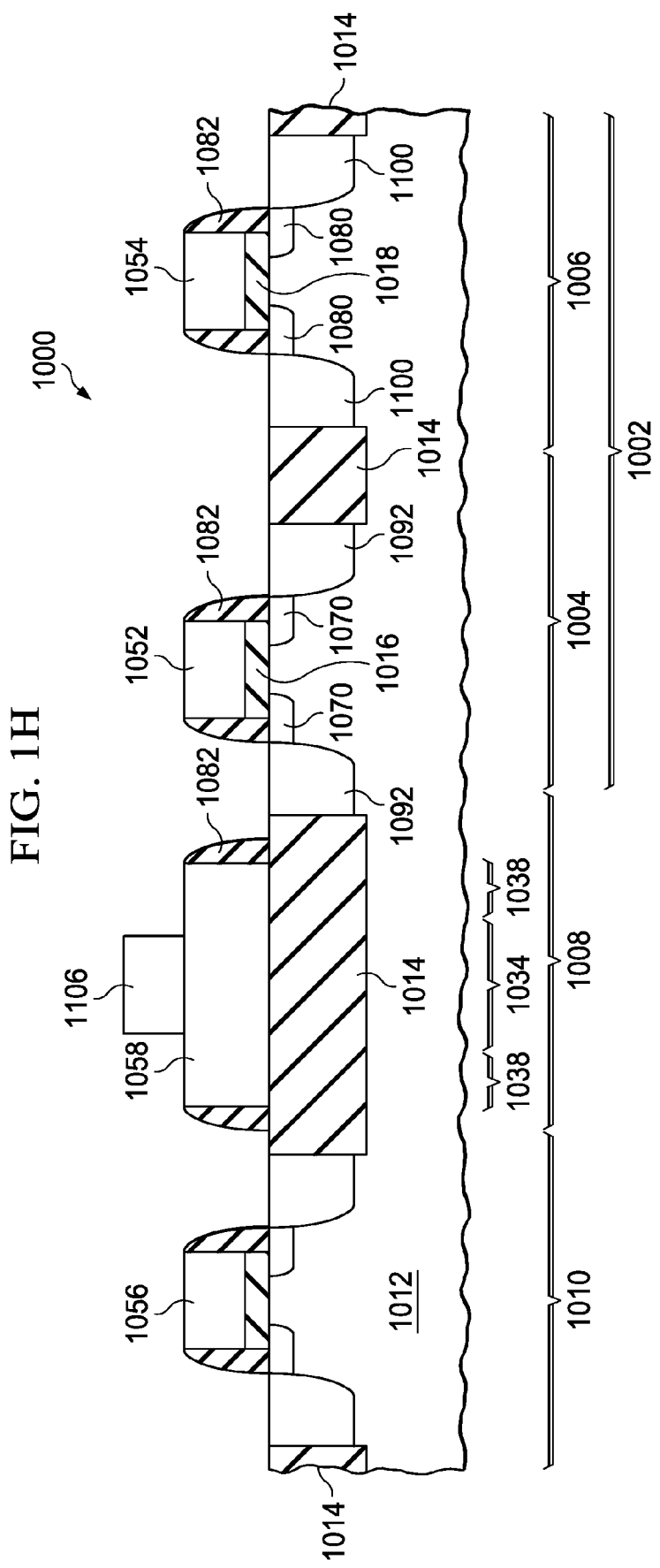

Referring to FIG. 1H, a resistor silicide block layer 1106 is formed over the body region 1034 of the resistor layer 1058. Material in the resistor silicide block layer 1106 is not formed concurrently with material in the sidewall spacers 1082. The resistor silicide block layer 1106 may be formed, for example, of silicon dioxide between 10 and 200 nanometers thick by thermal decomposition of tetraethyl orthosilicate, also known as tetraethoxysilane or TEOS. Forming the resistor silicide block layer 1106 using other materials is within the scope of the instant embodiment. In the instant embodiment, the resistor silicide block layer 1106 completely covers the body region 1034 but may expose the head regions 1038.

Figure 1I:
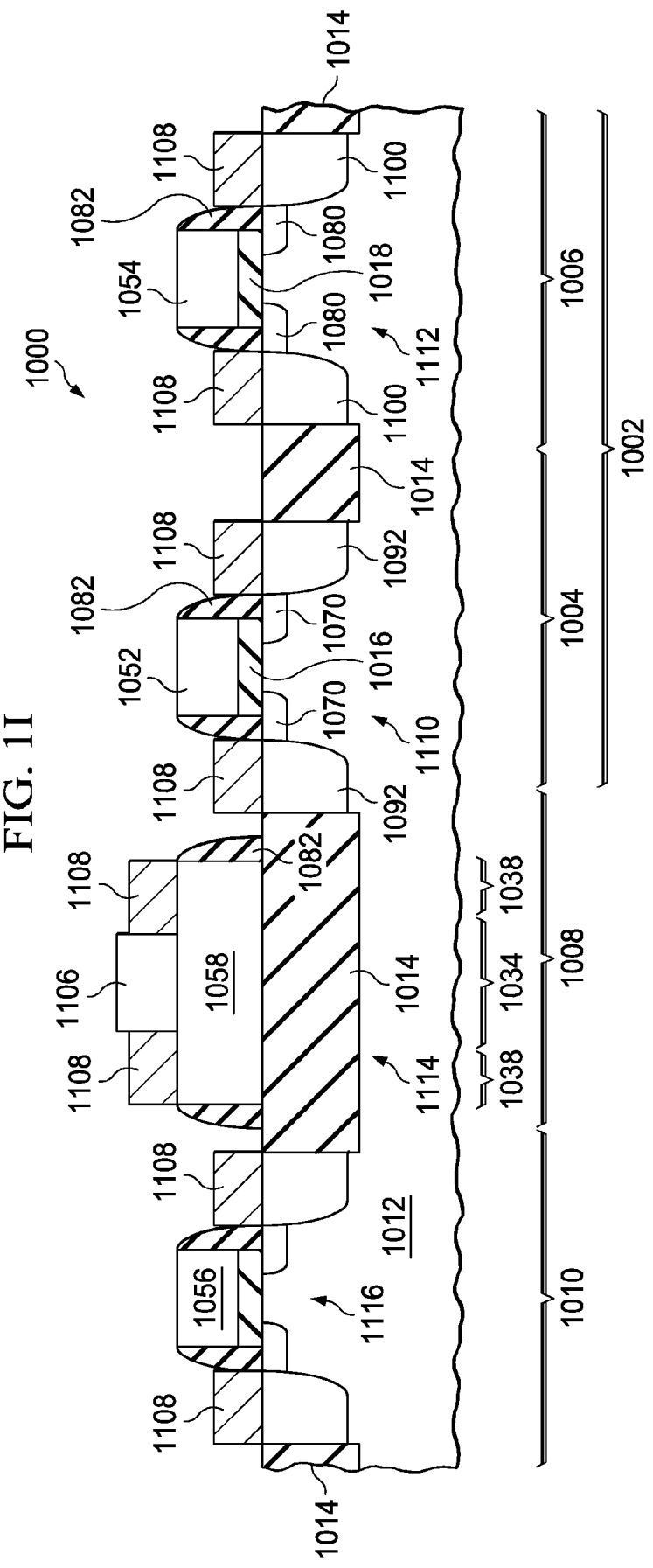

Referring to FIG. 1I, metal silicide layers 1108 are formed on exposed silicon at an existing top surface of the integrated circuit 1000, for example on the NSD layers 1092 of the NMOS transistor 1110, on the PSD layers 1100 of the PMOS transistor 1112, on the head regions 1038 of the resistor 1114, and on the other component 1116 if formed. The metal silicide layers 1108 may be formed, for example, by depositing a layer of metal, such as titanium, cobalt, nickel, or platinum on a top surface of the integrated circuit 1000, heating the integrated circuit 1000 to react a portion of the metal with exposed silicon at the existing top surface of the integrated circuit 1000, and selectively removing unreacted metal from the integrated circuit 1000 surface, commonly by exposing the integrated circuit 1000 to wet etchants including a mixture of an acid and hydrogen peroxide. The resistor 1114 has a sheet resistance over 1000 ohms/square. In one version of the instant embodiment, the head regions 1038 and the body region 1034 are p-type. In a further version, an average density of p-type dopants in the head regions 1038 is at least 10 percent greater than an average density of p-type dopants in the body region 1034.

Figure 1J:
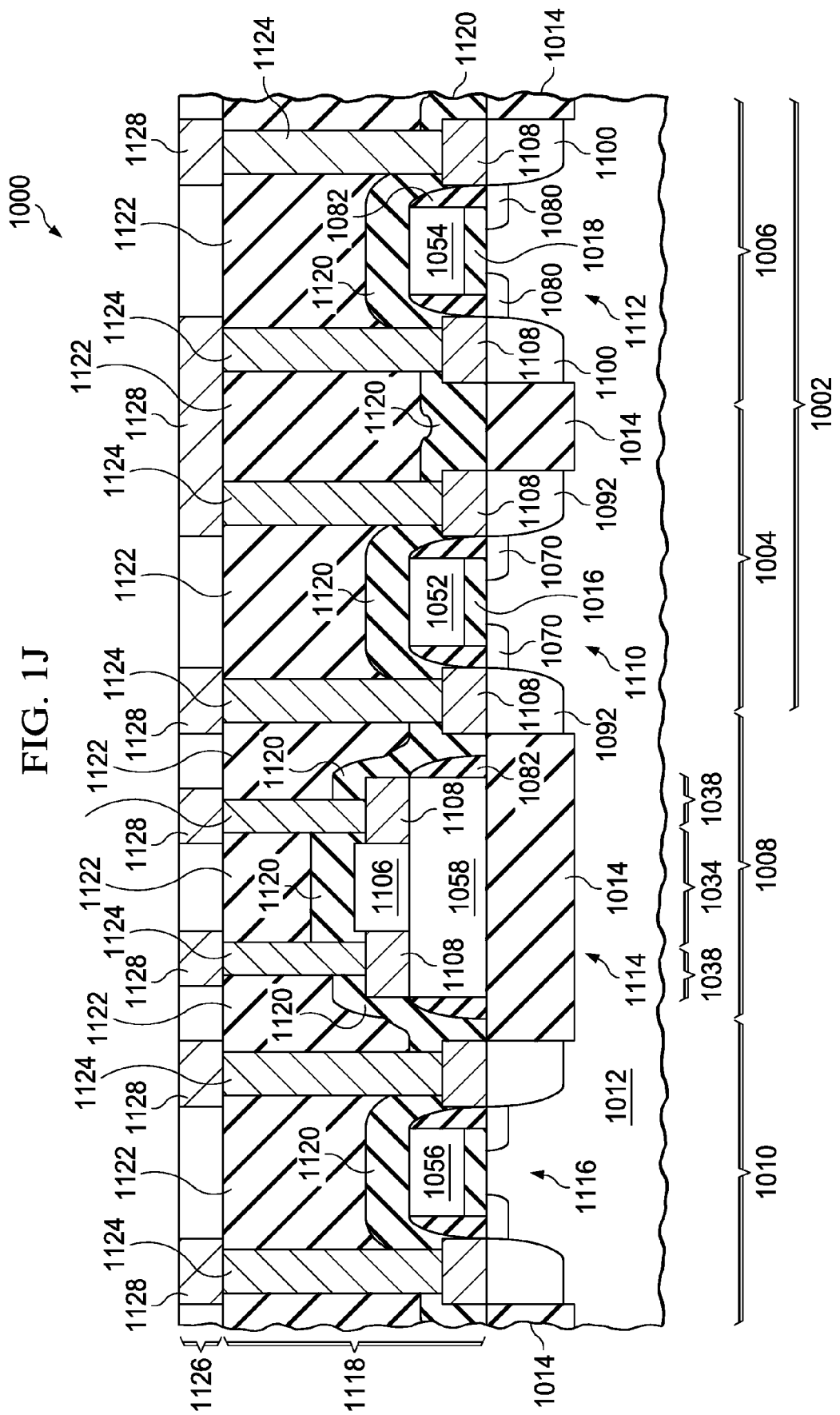

Referring to FIG. 1J, a pre-metal dielectric (PMD) layer 1118 is formed over an existing top surface of the integrated circuit 1000. The PMD layer 1118 may include a PMD liner 1120, a PMD main layer 1122, and an optional PMD cap layer, not shown. The PMD liner 1120 is commonly silicon nitride or silicon dioxide, 10 to 100 nanometers thick, deposited by plasma enhanced chemical vapor deposition (PECVD) on the existing top surface of the integrated circuit 1000. The PMD main layer 1122 may be a layer of silicon dioxide formed by a HARP process followed by a layer of silicon dioxide, phospho-silicate glass (PSG) or boro-phospho-silicate glass (BPSG), commonly 100 to 1000 nanometers thick, deposited by a PECVD process on a top surface of the PMD liner 1120, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer 1122.

Contacts 1124 are formed through the PMD main layer 1122 and through the PMD liner 1120 to make electrical contact to the silicide layers 1108 on the NSD layers 1092 of the NMOS transistor 1110, on the PSD layers 1100 of the PMOS transistor 1112, possibly on the head regions 1038 of the resistor 1114, and on the other component 1116 if formed. The contacts 1124 may be formed by defining contact areas on a top surface of the PMD layer 1118 with a contact photoresist pattern, not shown, etching contact holes in the contact areas by removing PMD layer material using RIE etching methods to expose the silicide layers 1108, and filling the contact holes with a contact liner metal, such as titanium, and a contact fill metal, typically tungsten, followed by removal of the contact fill metal from the top surface of the PMD layer 1118 using etching and/or CMP methods.

An intrametal dielectric (IMD) layer 1126 is formed over the PMD layer 1118. The IMD layer 1126 may include one or more layers of silicon dioxide, a low-k material such as organo-silicate glass (OSG), carbon-doped silicon oxides (SiCO or CDO) or methylsilsesquioxane (MSQ), or an ultra low-k dielectric material such as a porous OSG (p-OSG) with a dielectric constant less than 2.5. In one version of the instant embodiment, the IMD layer 1126 may be between 50 and 200 nanometers thick. The IMD layer 1126 may be formed by any combination of chemical vapor deposition (CVD), PECVD, low pressure chemical vapor deposition (LPCVD), atmospheric pressure chemical vapor deposition (APCVD), HDP, HARP, or other suitable dielectric layer formation process.

First level metal interconnects 1128 are formed in the IMD layer 1126 so as to make electrical connection to the contacts 1124. In one version of the instant embodiment, the first level metal interconnects 1128 may be formed of copper in a tantalum nitride liner using a damascene process after the IMD layer 1126 is formed. In another version, the first level metal interconnects 1128 may be formed of aluminum using a deposition, pattern and etch process sequence prior to formation of the IMD layer 1126. Other processes to form the first level metal interconnects 1128 are within the scope of the instant embodiment. In particular, the contact 1124 on a drain node of the NMOS transistor 1110 is electrically connected through a first level metal interconnect 1128 to the contact 1124 on a drain node of the PMOS transistor 1112. FIG. 1A through FIG. 1J depict the NMOS transistor 1110 and PMOS transistor 1112 adjacent to the resistor 1114. In other versions of the instant embodiment, the resistor 1114 may be spatially separated from the NMOS transistor 1110 and PMOS transistor 1112.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps:
   providing a substrate;
   forming a gate dielectric layer on said substrate;
   forming a gate polysilicon layer over said substrate and said gate dielectric layer;
   etching said gate polysilicon layer to form:
      an NMOS gate and a PMOS gate on said gate dielectric layer; and
      a resistor layer, said resistor layer having a body region and having head regions at each end of said body region;
   forming sidewall spacers abutting said NMOS gate and abutting said PMOS gate;

forming an NSD implant mask over said substrate which:
  exposes said NMOS gate and said substrate adjacent to said NMOS gate;
  exposes said body region of said resistor layer; and
  covers said PMOS gate and said substrate adjacent to said PMOS gate
performing an NSD implant operation which implants n-type dopants into said substrate adjacent to said NMOS gate to form NSD layers and into said body region of said resistor layer;
forming a PSD implant mask over said substrate which:
  exposes said PMOS gate and said substrate adjacent to said PMOS gate;
  exposes said body region of said resistor layer; and
  covers said NMOS gate and said substrate adjacent to said NMOS gate
performing a PSD implant operation which implants p-type dopants into said substrate adjacent to said PMOS gate to form PSD layers and into said body region of said resistor layer;
forming a resistor silicide block layer over said body region of said resistor layer, such that said resistor silicide block layer includes different dielectric material than said sidewall spacers;
forming metal silicide layers on said head regions of said resistor layer, on said NSD layers adjacent to said NMOS gate, and on said PSD layers adjacent to said PMOS gate;
forming a PMD layer over said silicide layers and over said resistor silicide block layer; and
forming contacts through said PMD layer, said contacts making electrical connection to said silicide layers on said NSD layers and to said silicide layers on said PSD layers.

2. The process of claim 1, in which said resistor silicide block layer includes silicon dioxide.

3. The process of claim 1, further including steps:
forming an n-channel lightly doped drain (NLDD) implant mask over said substrate, after said step of etching said gate polysilicon layer and prior to said step of forming said sidewall spacers, which:
  exposes said NMOS gate and said substrate adjacent to said NMOS gate;
  covers said body region of said resistor layer; and
  covers said PMOS gate and said substrate adjacent to said PMOS gate;
performing an NLDD implant operation which implants n-type dopants into said substrate adjacent to said NMOS gate to form NLDD layers;
forming a p-channel lightly doped drain (PLDD) implant mask over said substrate, after said step of etching said gate polysilicon layer and prior to said step of forming said sidewall spacers, which:
  exposes said PMOS gate and said substrate adjacent to said PMOS gate;
  covers said body region of said resistor layer; and
  covers said NMOS gate and said substrate adjacent to said NMOS gate; and
performing a PLDD implant operation which implants p-type dopants into said substrate adjacent to said PMOS gate to form PLDD layers.

4. The process of claim 3, in which:
said NLDD implant mask covers said head regions of said resistor layer; and
said PLDD implant mask covers said head regions of said resistor layer.

5. The process of claim 3, in which:
said body region of said resistor layer is p-type;
said head regions of said resistor layer are p-type;
said NLDD implant mask covers said head regions of said resistor layer;
said PLDD implant mask covers said head regions of said resistor layer;
said NSD implant mask covers said head regions of said resistor layer; and
said PSD implant mask exposes said head regions of said resistor layer so that said PSD implant operation implants p-type dopants into said head regions.

6. The process of claim 3, in which:
said body region of said resistor layer is n-type;
said head regions of said resistor layer are n-type;
said NLDD implant mask covers said head regions of said resistor layer;
said PLDD implant mask covers said head regions of said resistor layer;
said NSD implant mask exposes said head regions of said resistor layer so that said NSD implant operation implants n-type dopants into said head regions; and
said PSD implant mask covers said head regions of said resistor layer.

7. The process of claim 3, in which:
said body region of said resistor layer is p-type;
said head regions of said resistor layer are p-type;
said NLDD implant mask covers said head regions of said resistor layer;
said PLDD implant mask exposes said head regions of said resistor layer so that said PLDD implant operation implants p-type dopants into said head regions;
said NSD implant mask exposes said head regions of said resistor layer so that said NSD implant operation implants n-type dopants into said head regions; and
said PSD implant mask exposes said head regions of said resistor layer so that said PSD implant operation implants p-type dopants into said head regions.

8. The process of claim 3, in which:
said body region of said resistor layer is n-type;
said head regions of said resistor layer are n-type;
said NLDD implant mask exposes said head regions of said resistor layer so that said NLDD implant operation implants n-type dopants into said head regions;
said PLDD implant mask covers said head regions of said resistor layer;
said NSD implant mask exposes said head regions of said resistor layer so that said NSD implant operation implants n-type dopants into said head regions; and
said PSD implant mask exposes said head regions of said resistor layer so that said PSD implant operation implants p-type dopants into said head regions.

9. The process of claim 1, in which:
said body region of said resistor layer is p-type;
said head regions of said resistor layer are p-type;
said NLDD implant mask covers said head regions of said resistor layer;
said PLDD implant mask exposes said head regions of said resistor layer so that said PLDD implant operation implants p-type dopants into said head regions;
said NSD implant mask covers said head regions of said resistor layer; and
said PSD implant mask exposes said head regions of said resistor layer so that said PSD implant operation implants p-type dopants into said head regions.

10. The process of claim 1, further including steps:
forming an n-channel lightly doped drain (NLDD) implant mask over said substrate, after said step of etching said gate polysilicon layer and prior to said step of forming said sidewall spacers, which:
  exposes said NMOS gate and said substrate adjacent to said NMOS gate;
  exposes said body region of said resistor layer; and
  covers said PMOS gate and said substrate adjacent to said PMOS gate;
performing an NLDD implant operation which implants n-type dopants into said substrate adjacent to said NMOS gate to form NLDD layers and into said body region;
forming a p-channel lightly doped drain (PLDD) implant mask over said substrate, after said step of etching said gate polysilicon layer and prior to said step of forming said sidewall spacers, which:
  exposes said PMOS gate and said substrate adjacent to said PMOS gate;
  covers said body region of said resistor layer; and
  covers said NMOS gate and said substrate adjacent to said NMOS gate; and
performing a PLDD implant operation which implants p-type dopants into said substrate adjacent to said PMOS gate to form PLDD layers.

11. The process of claim 1, further including steps:
forming an n-channel lightly doped drain (NLDD) implant mask over said substrate, after said step of etching said gate polysilicon layer and prior to said step of forming said sidewall spacers, which:
  exposes said NMOS gate and said substrate adjacent to said NMOS gate;
  covers said body region of said resistor layer; and
  covers said PMOS gate and said substrate adjacent to said PMOS gate;
performing an NLDD implant operation which implants n-type dopants into said substrate adjacent to said NMOS gate to form NLDD layers;
forming a p-channel lightly doped drain (PLDD) implant mask over said substrate, after said step of etching said gate polysilicon layer and prior to said step of forming said sidewall spacers, which:
  exposes said PMOS gate and said substrate adjacent to said PMOS gate;
  exposes said body region of said resistor layer; and
  covers said NMOS gate and said substrate adjacent to said NMOS gate; and
performing a PLDD implant operation which implants p-type dopants into said substrate adjacent to said PMOS gate to form PLDD layers and into said body region.

12. The process of claim 1, further including steps:
forming an n-type pre gate etch implant mask over said substrate, after said step of forming said gate polysilicon layer and prior to said step of etching said gate polysilicon layer, which:
  exposes an area for said NMOS gate;
  exposes an area for said body region of said resistor layer; and
  covers an area for said PMOS gate; and
performing an n-type pre gate etch implant operation which implants n-type dopants into said gate polysilicon layer in said area for said NMOS gate and into said area for said body region.

13. The process of claim 1, further including steps:
forming a p-type pre gate etch implant mask over said substrate, after said step of forming said gate polysilicon layer and prior to said step of etching said gate polysilicon layer, which:
  exposes an area for said PMOS gate;
  exposes an area for said body region of said resistor layer; and
  covers an area for said NMOS gate; and
performing a p-type pre gate etch implant operation which implants p-type dopants into said gate polysilicon layer in said area for said PMOS gate and into said area for said body region.

14. The process of claim 1, further including steps:
forming an other component implant mask over said substrate, which:
  exposes an area for an other component in said integrated circuit;
  cover an area for said PMOS gate;
  cover an area for said body region of said resistor layer; and
  covers an area for said NMOS gate; and
performing an other component implant operation which implants dopants into said area for said other component.

15. The process of claim 1, in which:
said body region of said resistor layer is p-type; and
said head regions of said resistor layer are p-type.

16. The process of claim 1, in which an average density of p-type dopants in said head regions of said resistor layer is at least 10 percent greater than an average density of p-type dopants in said body region of said resistor layer.

* * * * *